(12) United States Patent
Cripe et al.

(10) Patent No.: US 8,441,317 B1
(45) Date of Patent: May 14, 2013

(54) TAPERED-IMPEDANCE DISTRIBUTED SWITCHING POWER AMPLIFIER

(71) Applicants: David W. Cripe, Mount Vernon, IA (US); Scott L. Patten, Marion, IA (US); Don L. Landt, Palo, IA (US); Forest P. Dixon, Loveland, CO (US)

(72) Inventors: David W. Cripe, Mount Vernon, IA (US); Scott L. Patten, Marion, IA (US); Don L. Landt, Palo, IA (US); Forest P. Dixon, Loveland, CO (US)

(73) Assignee: Rockwell Collins, Inc., Cedar Rapids, IA (US)

(\*) Notice: Subject to any disclaimer, the term of this patent is extended or adjusted under 35 U.S.C. 154(b) by 0 days.

(21) Appl. No.: 13/667,642

(22) Filed: Nov. 2, 2012

Related U.S. Application Data

(62) Division of application No. 13/086,843, filed on Apr. 14, 2011, now Pat. No. 8,310,305.

(51) Int. Cl.
 *H03F 3/217* (2006.01)
(52) U.S. Cl.
 USPC ........................................ 330/251; 330/207 A
(58) Field of Classification Search ................... 330/251, 330/207 A, 146
 See application file for complete search history.

(56) References Cited

U.S. PATENT DOCUMENTS

| 5,327,337 | A | 7/1994 | Cripe | |
| 6,281,767 | B1* | 8/2001 | Lastrucci | 333/167 |
| 6,605,991 | B2 | 8/2003 | Midya et al. | |
| 7,482,865 | B2 | 1/2009 | Kost et al. | |
| 7,585,037 | B2* | 9/2009 | Tabata et al. | 347/10 |
| 7,714,649 | B1 | 5/2010 | Cripe | |
| 7,822,214 | B1* | 10/2010 | Melanson | 381/100 |

\* cited by examiner

*Primary Examiner* — Henry Choe
(74) *Attorney, Agent, or Firm* — Donna P. Suchy; Daniel M. Barbieri

(57) ABSTRACT

A distributed power amplifier may include a plurality of switching power amplifier sub-circuits, and a plurality of connection network sub-circuits, each of the plurality of connection network sub-circuits having a characteristic impedance, wherein each of the plurality of connection network sub-circuits combines two or more of the plurality of switching power amplifier sub-circuits into a parallel or series configuration, wherein the plurality of switching power amplifier sub-circuits, the plurality of connection network sub-circuits and the characteristic impedance of each of the plurality of connection network sub-circuits are configured to present each of the plurality of switching power amplifier sub-circuits with a substantially equivalent load impedance.

9 Claims, 9 Drawing Sheets

1/4 Wave Transmission Line 90 degree T network 90 degree Pi network

TAPERED-IMPEDANCE DISTRIBUTED SWITCHING POWER AMPLIFIER

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled TAPERED-IMPEDANCE DISTRIBUTED SWITCHING POWER AMPLIFIERS, naming David Cripe, Scott Patten, Don Landt, and Forest Dixon as inventors, filed Apr. 14, 2011, application Ser. No. 13/086,843.

TECHNICAL FIELD

The present invention generally relates to switching power amplifier circuits, and more particularly to a tapered-impedance distributed switching power amplifier circuits.

BACKGROUND

In the design and construction of systems for high power radio frequency (RF) generation, it is desirable to develop systems with improved conversion efficiencies, as the operating temperatures of the component power amplifier (PA) transistors are often a limiting factor. A variety of circuits have been developed in order to increase the efficiency of an RF power amplifier by exploiting the switching characteristics of a power amplifier device. Such systems are known in the art as switching power amplifiers. The most common switching power amplifiers include the class-D, class-E, and class-F switching circuits.

As shown in FIG. 1, a class-D power amplifier includes a first switching device Q and a second switching device /Q arranged in a "totem pole" configuration. Each device is driven to conduct complementarily through 180 degrees out of each RF cycle. The output of a class-D power amplifier is a square-wave voltage waveform, with the amplifier being fed from a low-impedance voltage bus. The load network of the class-D power amplifier includes a series-tuned band pass filter, permitting the conduction of a current waveform consisting primarily of a carrier frequency having highly attenuated harmonics. As a result, the current conducted by each PA switch is a half-sinusoid waveform.

Those skilled in the art will recognize that traditional power switching devices suffer from parasitic reactances. The parasitic reactances exist due to capacitance associated with the drain-source of a component PA transistor and the inductance associated with the transistor interconnections. Parasitic reactances may cause undesired resonances within the PA transistor waveforms, and may degrade efficiency at higher frequencies.

FIG. 2 illustrates a schematic view for a class-F power amplifier utilized to ameliorate the effects of the parasitic reactances of the transistors. The class-F amplifier consists of a choke-fed, grounded-source switching device, which is connected via a quarter-wave transmission line (labeled ¼ wave in FIG. 2) to a parallel LRC band-pass filter. The band-pass filter of the class-F PA presents a low-magnitude impedance to all harmonics except the fundamental of the frequency of operation. The ¼ wave transmission transforms the impedance in a manner which presents the drain of the transistor with a high impedance to all odd-order harmonics. Consequently, the drain voltage waveform is a square wave, while the drain current waveform is a half-sinusoid, conducted during the time frame in which the drain-source voltage is at its minimum. Moreover, the transistor interconnection inductance may be considered absorbed into the transmission line section.

FIG. 3 illustrates a schematic view of a push-pull class-F amplifier, which is a variation of the class-F power amplifier depicted in FIG. 2. The push-pull class-F power amplifier may be constructed by replacing the RF choke of the tradition class-F power amplifier with an additional switch and transmission line. The second transistor of the push-pull class-F power amplifier is driven in opposition to the lower device, creating a push-pull circuit.

FIG. 4 illustrates a class-E power amplifier. The class-E power amplifier topology is capable of absorbing both the transistor parasitic shunt capacitance and the interconnect inductance into its resonant circuit. The output network of the class-E power amplifier has a net impedance at the frequency of operation with a nominally 52 degree inductive component, while presenting a much larger impedance at all higher harmonics. The switch of the class-E power amplifier is driven at a nominal 50% duty, with the drain-source voltage waveform being a damped sinusoid, which returns to zero volts prior to the commencement of the conducitve half-cycle of the switch. Moreover, the drain current of the class-E power amplifier is a sinusoidal segment, beginning at zero amps at the commencement of the conductive half-cycle.

FIG. 5 illustrates a simplified version of the class-E power amplifier circuit. In the simplified class-E power amplifier circuit, the output loading circuit is placed between the supply voltage and the resonant switch circuit.

The combination of power amplifiers, such as class-D, class-E, and class-F power amplifiers, poses several difficulties. Power amplifiers, unlike passive components, cannot simply be connected in parallel or series to sum their outputs. It is therefore desirable to create a circuit or system of circuits which effectively combine various power amplifiers. More specifically, it is desirable to create a distributed amplifier utilizing a number of switching power amplifier circuits.

SUMMARY

A distributed power amplifier is disclosed. In one aspect, the distributed power amplifier may include, but is not limited to, a plurality of switching power amplifier sub-circuits, and a plurality of connection network sub-circuits, each of the plurality connection network sub-circuits having a characteristic impedance, wherein each of the plurality of connection network sub-circuits combines at least two of the plurality of switching power amplifier sub-circuits into a substantially parallel configuration such that each of the plurality of switching power amplifier sub-circuits is presented with a substantially equivalent voltage waveforms, wherein the plurality of switching power amplifier sub-circuits, the plurality of connection network sub-circuits and the characteristic impedance of each of the plurality of connection network sub-circuits are configured to present each of the plurality of switching power amplifier sub-circuits with a substantially equivalent load impedance such that each of the plurality of switching power amplifier sub-circuits has a substantially equivalent drain current waveform.

In another aspect, the distributed power amplifier may include, but is not limited to, a plurality of switching power amplifier sub-circuits, and a plurality of connection network sub-circuits, each of the plurality connection network sub-circuits having a characteristic impedance, wherein each of the plurality of connection network sub-circuits combines at least two of the plurality of switching power amplifier sub-circuits into a substantially series configuration such that each of the plurality of switching power amplifier sub-circuits is presented with a substantially equivalent current waveform, wherein the plurality of switching power amplifier sub-circuits, the plurality of connection network sub-circuits and the characteristic impedance of each of the plurality of connection network sub-circuits are configured to present each of the plurality of switching power amplifier sub-circuits with a substantially equivalent load impedance such that each of the plurality of switching power amplifier sub-circuits has a substantially equivalent drain voltage waveform.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIGS. 6A through 11, a distributed switching power amplifier is described in accordance with the present disclosure. Combining multiple switching power amplifier sub-circuits using properly configured intermittent connection network sub-circuits may provide a more efficient and superior distributed switching power amplifier. The present invention is directed at providing a distributed switching power amplifier consisting of a sequence of switching power amplifier (PA) sub-circuits (e.g., Class-D, Class-E, or Class-F) combined via interposed connection network sub-circuits (e.g., quarter wave transmission line, T network, or Pi Network), wherein the individual connection network sub-circuits have a selected characteristic impedance in order to ensure each individual switching PA sub-circuit is presented with an equivalent load impedance. For instance, the successive connection network sub-circuits may be configured to have tapered impedances such that each successive connection network sub-circuit has an impedance which is incrementally increased or decreased, depending on the chosen topology. The result being a sequence of connection network sub-circuits having a step-wise increase or decrease in impedance along one direction of the transmission line of the distributed switching PA, as illustrated in FIGS. 7 through 11. Presenting each individual switching PA sub-circuit with the same loading impedance aids in providing equivalent voltage and current waveforms for each switching PA sub-circuit, a desirable characteristic of a distributed amplifier system. Moreover, whether the connection network sub-circuits used to combine the sequence of switching PA sub-circuits transforms a current waveform or voltage waveforms will depend on the specific topology of the distributed switching PA. The distributed switching PA (e.g., 700, 800, 900, 1000, and 1100) created by combining multiple switching PA sub-circuits may include two overarching topologies, namely a parallel configuration and a series configuration. Several embodiments of the distributed switching PA are described further herein. These descriptions should not be interpreted as limitations but merely illustrations of the present invention.

Figure 6A:
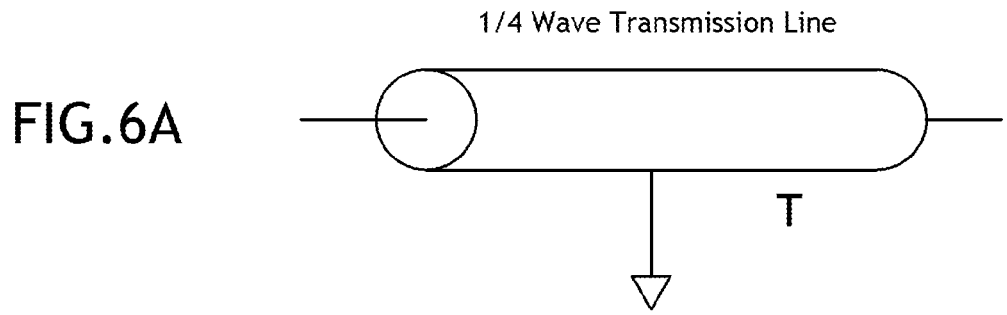
FIG. 6A is a circuit diagram illustrating a quarter-wave transmission line.
Figure 6B:
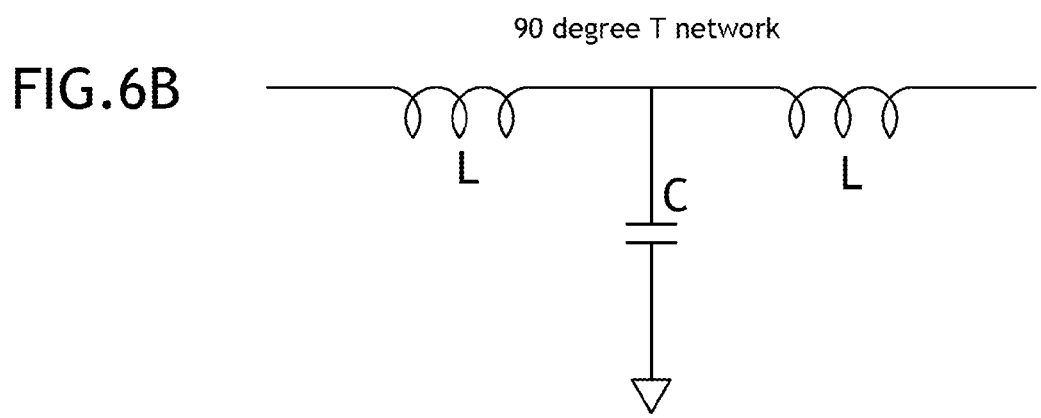
FIG. 6B is a circuit diagram illustrating a T-network.
Figure 6C:
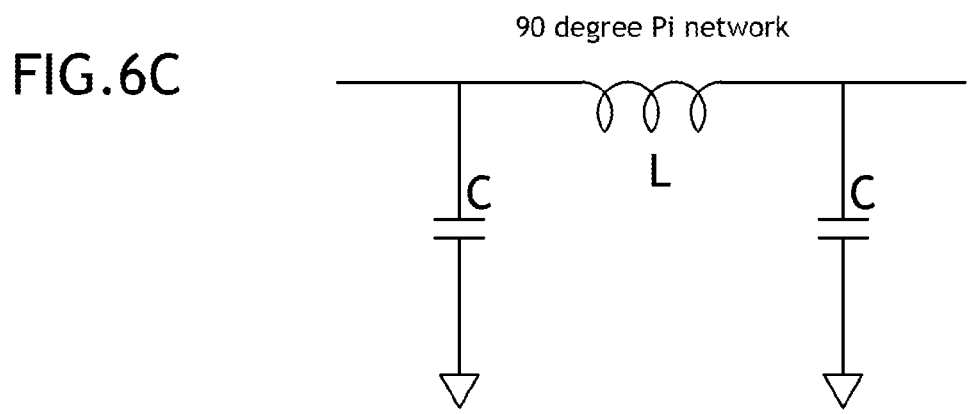
FIG. 6C is a circuit diagram illustrating a Pi-network.

Referring now to FIGS. 6A through 6C, the connection network sub-circuits utilized to interconnect the various power amplifier sub-circuits of the distributed amplifier are illustrated. FIG. 6A illustrates a quarter-wave transmission line suitable for use as an interconnection sub-circuit of the present invention. In one aspect, the transmission line possesses a characteristic length, expressed in a fractional wavelength at a particular frequency. In addition, the transmission line possesses a characteristic impedance, given by the square root of the ratio of the value of infinitesimal inductance to capacitance, per unit length. A quarter-wave transmission line may perform an impedance transformation. For instance, when terminated with an impedance X, the input impedance of the transmission line having a characteristic impedance Z is given by:

$$Z_{in} = \frac{Z^2}{X} \quad \text{(Eqn. 1)}$$

FIG. 6B illustrates a T-network interconnection sub-circuit. A T-network may be described by the angular phase shift for a particular RF frequency. For a ±90 degree T-network, the characteristic impedance of the network will equal the magnitude of the impedances of the inductors and capacitors of the network at the particular RF frequency.

FIG. 6C illustrates a Pi-network interconnection sub-circuit. Similar to the T-network, a Pi-network may be described by the angular phase shift for a particular RF frequency. For a ±90 degree Pi-network, the characteristic impedance of the network will equal the magnitude of the impedances of the inductors and capacitors of the network at the particular RF frequency.

The interconnection sub-circuits illustrated in FIGS. 6A through 6C may be utilized to interconnect various power amplifier sub-circuits in order to construct a distributed power amplifier device. Reference will be made throughout the following disclosure to transmission line, T-network, and Pi-network interconnection sub-circuits and there implementation in a distributed amplifier context. The above description should not be considered a limitation, but merely an illustration of the principles of the various interconnection sub-circuits.

Figure 7:
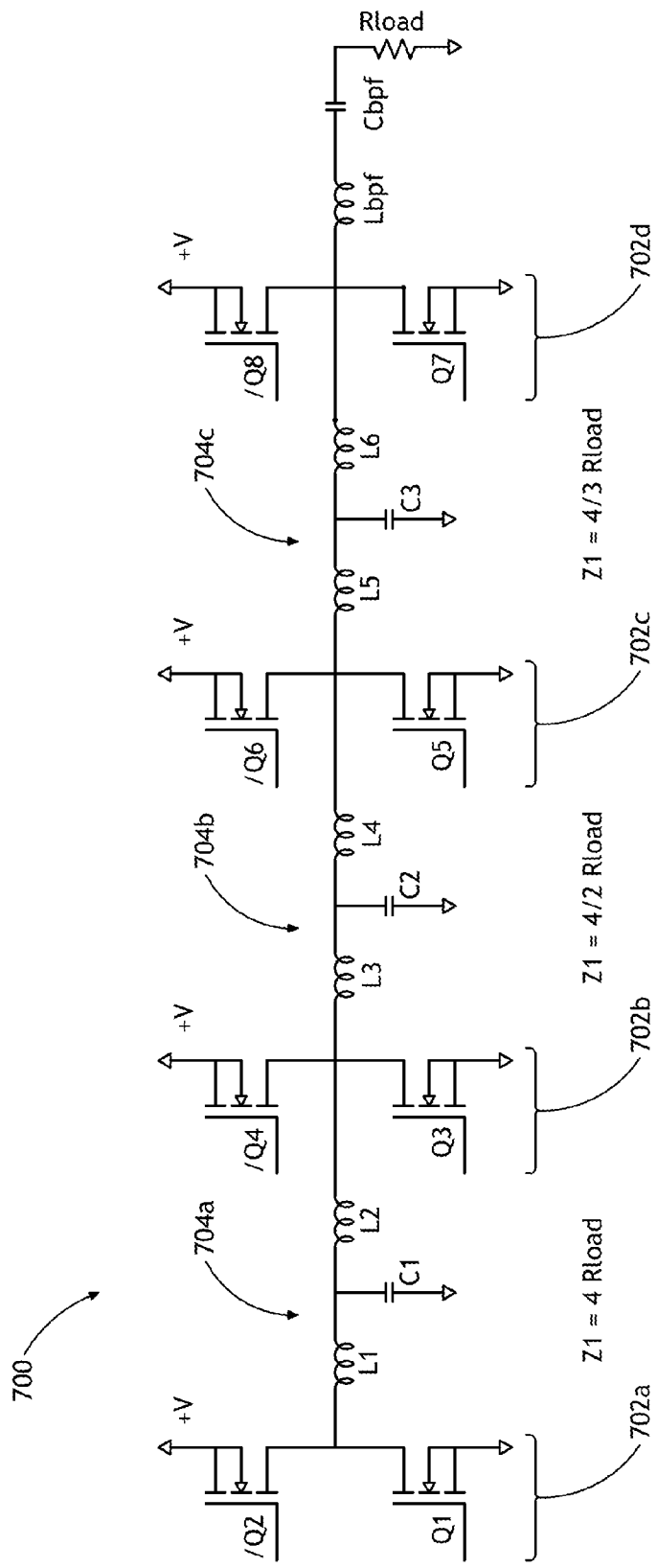
FIG. 7 is a circuit diagram illustrating a distributed Class D power amplifier, in accordance with one embodiment of the present invention.

Referring now to FIG. 7, a circuit diagram for a distributed switching power amplifier 700 constructed by combining multiple Class-D switching power amplifier (PA) sub-circuits 702a-702d is displayed. In one embodiment, each of the Class-D switching power amplifier sub-circuits 702a-702d may include a pair of high power switching devices (e.g., Q1-Q8) arranged in a half-bridge configuration. For example, sub-circuit 702a may include the high powered switching devices Q1 and Q2, where Q1 and Q2 are arranged in a traditional Class D half-bridge configuration. Similarly, sub-circuit 702b, sub-circuit 702c, and sub-circuit 702d may include half-bridged switching device pairs Q3-Q4, Q5-Q6, and Q7-Q7 respectively. Further, the high power switching devices Q1-Q8 may include, but are not limited to MOSFET switching devices.

As discussed above, the Class D switching PA sub-circuits 702a-702d of the Class D distributed switching PA 700 may provide a high efficiency power amplification building block suitable for use at high frequencies (i.e., 100 kHz to 1 GHz). The Class D switching PA sub-circuits operate by switching output devices between an "on" and "off" state. In the case of a MOSFET based Class D switching PA sub-circuit, in the "on" state a given amount of current flows through the Class D sub-circuit, while approximately zero voltage is present from the drain to source. As a result, power dissipation (i.e., P=VI) is approximately zero. In the "off" state, an open circuit is present and, therefore, no current flows through the device. Thus, similar to the "on" state, power dissipation in the "off" state for a Class D switching PA sub-circuit is also zero.

It is recognized that, due to the quasi-parallel arrangement of the Class D distributed switching PA, each of the switching PA sub-circuits 702a-702d will have approximately an equivalent voltage waveform at the switching node of the Class D half-bridge sub-circuit. It is an object of the present invention to configure the Class D distributed switching PA using connection network sub-circuits 704a-704c such that an equivalent current waveform also exists at each of the switching PA sub-circuits 702a-702d. The combination of the parallel design and the introduction of the connection network sub-circuits results in each switching PA sub-circuit 702a-702d having equivalent current and voltage waveforms.

In one aspect of the present invention, the Class D switching PA sub-circuits 702a-702d may be combined using the connection network sub-circuits 704a-704c such that each switching PA sub-circuit 702a-702d is presented with the same load impedance. In order to provide equal loading on each Class D switching PA sub-circuit 700 in a distributed Class D switching PA having a load impedance of $Z_0$ and power amplifier sub-circuits 702a-702d, the connection network sub-circuits 704a-704c between the power amplifier sub-circuits 702a-702d must perform an impedance transformation.

In a further aspect, illustrated in FIG. 7, each switching PA sub-circuit 702a-702d must be presented with a load impedance, provided by the connection network sub-circuits 704a-704c, which increases successively with each switching PA sub-circuit progressing toward the load. For purposes of illustration, it is assumed herein that the output loading of the distributed switching PA 700 is equal to the quantity "Rload," as illustrated in FIG. 7. In one embodiment, it is recognized that if the output loading equals Rload then switching PA sub-circuit 702a is presented with an impedance of 4·Rload. The next switching PA sub-circuit 702b may have an impedance of (4/2)·Rload. However, when the current from the first switching PA sub-circuit 702a is summed, the effective impedance at the second switching PA sub-circuit 702b is 4·Rload. Similarly, the impedance at the third switching PA sub-circuit 702c is (4/3)·Rload. Again, when summed with the currents of the previous PA sub-circuits, the effective impedance at the third switching PA sub-circuit is 4·Rload. It is recognized that the use of this tapered impedance configuration allows for the presentation of an equivalent effective load impedance of Rload at each switching PA sub-circuit 702a-702d of the distributed switching PA 700.

Moreover, the impedances of the configuration described above are provided via the connection network sub-circuits 704a-704c, wherein the characteristic impedances of the connection network sub-circuits 704a-704c are equal to the above impedances. More specifically, the characteristic impedances of each of the connection network sub-circuits 704a-704c used to connect successive switching PA sub-circuits 702a-702d for the above example are given by 4·Rload, (4/2)·Rload, and (4/3)·Rload respectively, as illustrated by Z1, Z2, and Z3 in FIG. 7.

In a general sense, the impedance for each successive node in the Class D switching PA may be expressed by:

$$Z_m = Z_0 \left( \frac{n}{m-1} \right) \qquad \text{(Eqn. 1)}$$

where $Z_0$ represents the load impedance of the distributed switching PA, n represents the number of switching PA sub-circuits in the distributed switching PA, and m represents the given node. It should be noted that when used in this context n must be greater than 2 and m must be equal to or greater than 2 but less than n.

It is further recognized that the connection network sub-circuits 704a-704c may be selected to impart a 90° phase shift at the frequency of operation. As a result, the drive signal to each successive switching PA sub-circuit is also delayed by 90°.

In the Class D switching PA configuration, it is necessary for the output network to present an impedance at the harmonic frequencies that is significantly larger than the impedance presented at the fundamental frequency. As a result, the preferred connection network sub-circuit for use in the Class D switching PA configuration includes the low pass T-network, illustrated in FIGS. 6B and 7, as it provides the above requirements.

It should be recognized that by utilizing the tapered impedances of the T-networks in order to combine Class D switching PA sub-circuits in the distributed switching PA the current in each of the T-networks may increase. While the current in each connection network builds, isolation between adjacent switching PA sub-circuits may be provided in such a way that the current that is drawn from each PA sub-circuit into the T-networks is controlled.

Figure 8:
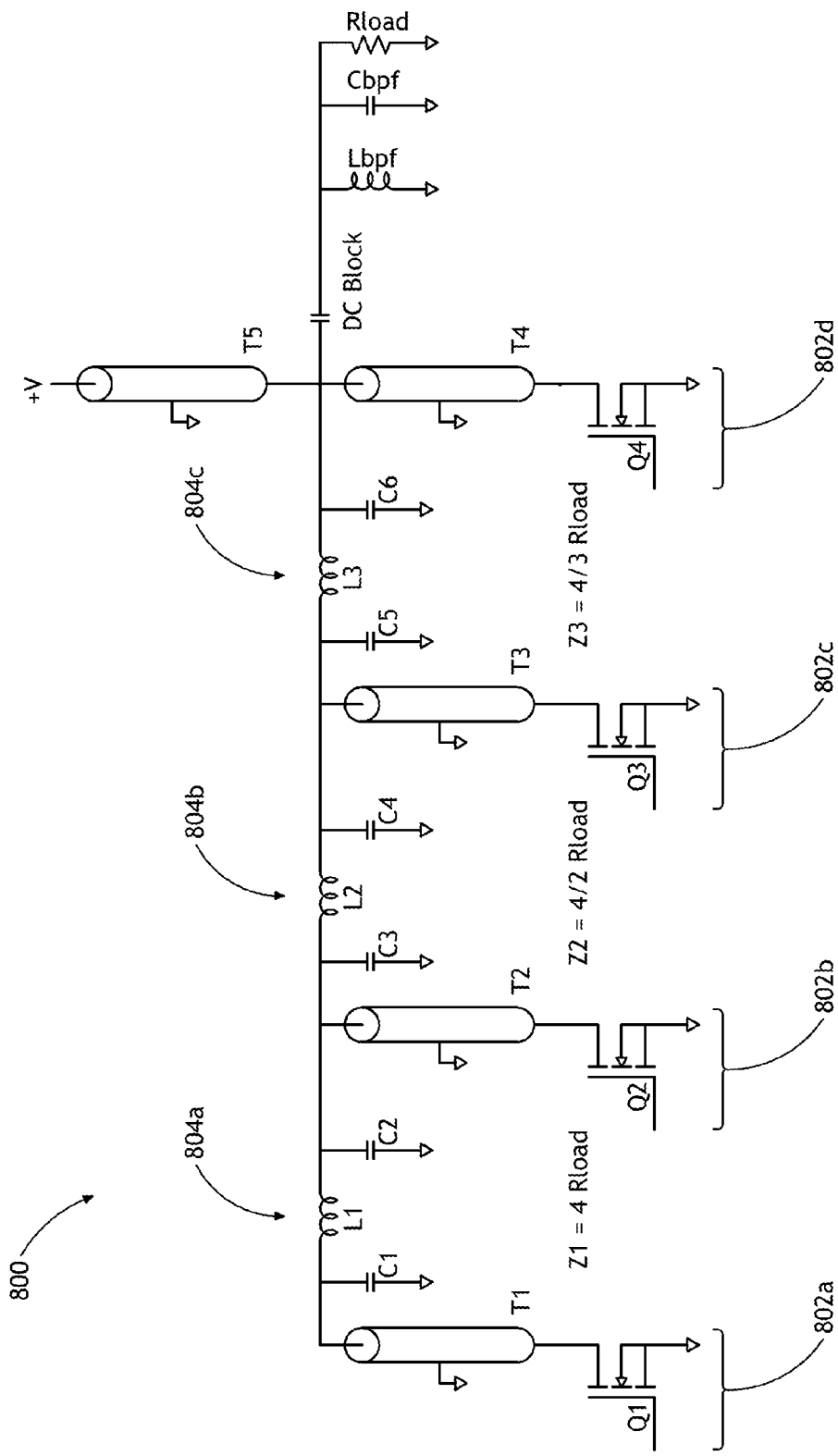
FIG. 8 is a circuit diagram illustrating a distributed parallel mode Class F power amplifier, in accordance with one embodiment of the present invention.

Referring now to FIG. 8, a circuit diagram for a distributed switching power amplifier 800 constructed by combining multiple Class-F switching power amplifier (PA) sub-circuits 802a-802d in a quasi-parallel configuration is displayed. As observed in the case of the Class D distributed switching PA, the voltage waveforms at each Class F switching PA sub-circuit are substantially equivalent due to the parallel nature of the parallel mode Class F distributed switching PA. In a manner analogous to the distributed Class D switching PA 700, Class F switching PA sub-circuits 802a-802d may be combined utilizing connection network sub-circuits 804a-804c in order to ensure the drain current of each Class F switching PA sub-circuit is substantially equivalent.

Moreover, the tapered impedance requirements present in the distributed Class D switching PA 700 also exists in the parallel mode Class F switching PA 800. More specifically, the impedance profile for connection network sub-circuits 804a-804c must be tapered. The tapering may occur such that, given an output load of Rload, the impedances of the 804a, 804b, and 804c connection networks required to ensure the current waveforms at each Class F switching PA sub-circuit 802a-802d are equivalent are 4·Rload, (4/2)·Rload, and (4/3)·Rload respectively, as illustrated by Z1, Z2, and Z3 in FIG. 8. In a general sense, not limited to the specific illustration provided above, the impedance of each successive connection networks 804a, 804b, and 804c may be expressed using equation 1 above, in a manner similar to the Class D switching PA context.

In contrast to the Class D distributed PA 700, the preferred connection network sub-circuit for use in the parallel mode Class F switching PA 800 configuration includes the Pi-network, illustrated in FIG. 6C and FIG. 8. The Pi-network selected for implementation in the parallel mode Class F context is terminated both at the input and output of the Pi-network by a capacitor (e.g., C1 and C2 in FIG. 8). The capacitor terminated Pi-networks 804a-804c presents a low impedance to currents at the harmonics of the fundamental frequency, as required by the Class F switching PA sub-circuits 802a-802d. Further, the transmission lines T1-T4 of the Class F switching PA sub-circuits provide high impedances to current at harmonic frequencies, which is required in order to preserve the half-sinusoidal drain current waveform of the switching devices Q1-Q4 of the Class F switching PA sub-circuits 802a-802d.

It is further recognized that each transistor Q1-Q4 of the Class F switching PA sub-circuits, as you pass from left to right on FIG. 8, may have its drive signal delayed by 90° in order to coincide with the 90° phase shift of each connection network 804a-804d between the switching PA sub-circuits 802a-802d.

Implementation of the incrementally smaller characteristic impedances Z1-Z3 of the Pi-network connection networks 804a-804c used to connect the PA sub-circuits 802a-802d of the distributed PA 800 serves to equalize the drain currents in each PA sub-circuit as each PA sub-circuit contributes its individual power to the circuit 800.

Figure 1:
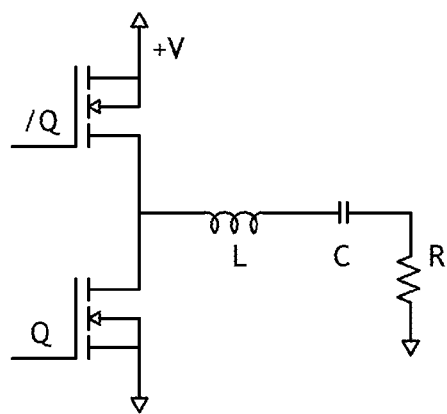
FIG. 1 is a circuit diagram illustrating a Class D power amplifier.
Figure 2:
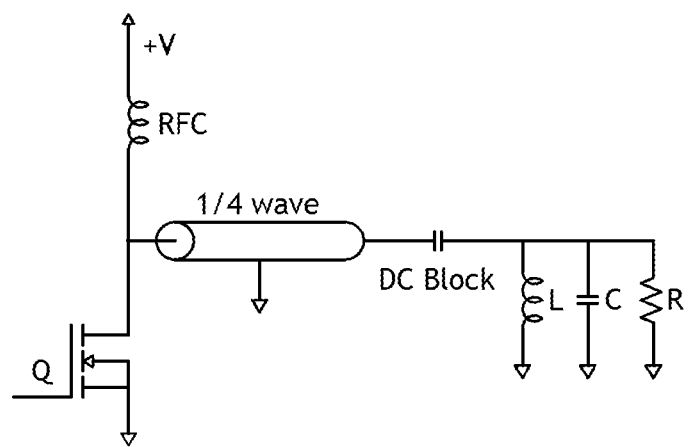
FIG. 2 is a circuit diagram illustrating a Class F power amplifier.
Figure 3:
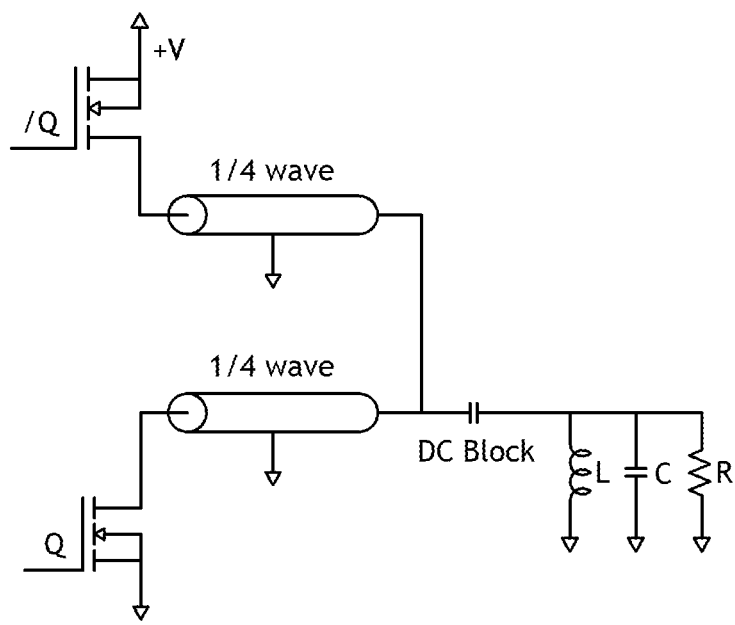
FIG. 3 is a circuit diagram illustrating a push-pull Class F power amplifier.
Figure 4:
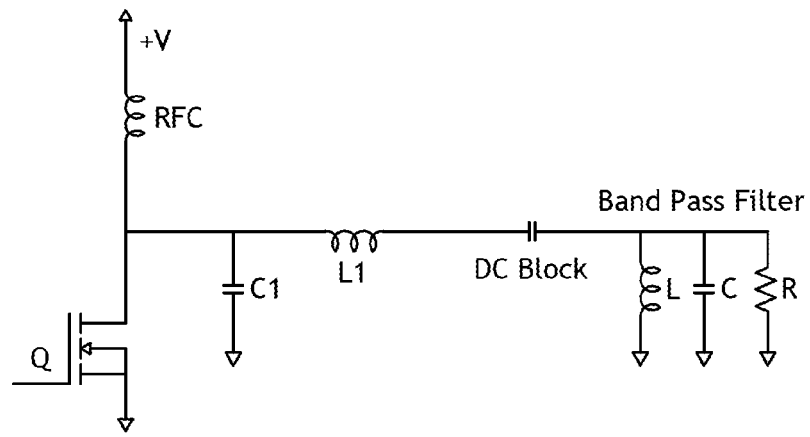
FIG. 4 is a circuit diagram illustrating a Class E power amplifier.
Figure 5:
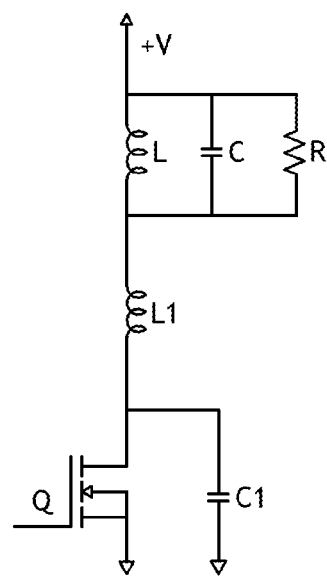
FIG. 5 is a circuit diagram illustrating a simplified Class E power amplifier.

It is further contemplated that the concepts described above with respect to the described distributed parallel mode Class F switching PA may be extended to a distributed parallel mode switching PA which incorporates push-pull Class F switching power amplifiers similar to the push-pull Class F amplifier illustrated in FIG. 3. For instance, multiple push-pull Class F switching power amplifiers sub-circuits may be combined using connection network sub-circuits to form a distributed parallel mode push-pull Class F switching PA.

Figure 9:
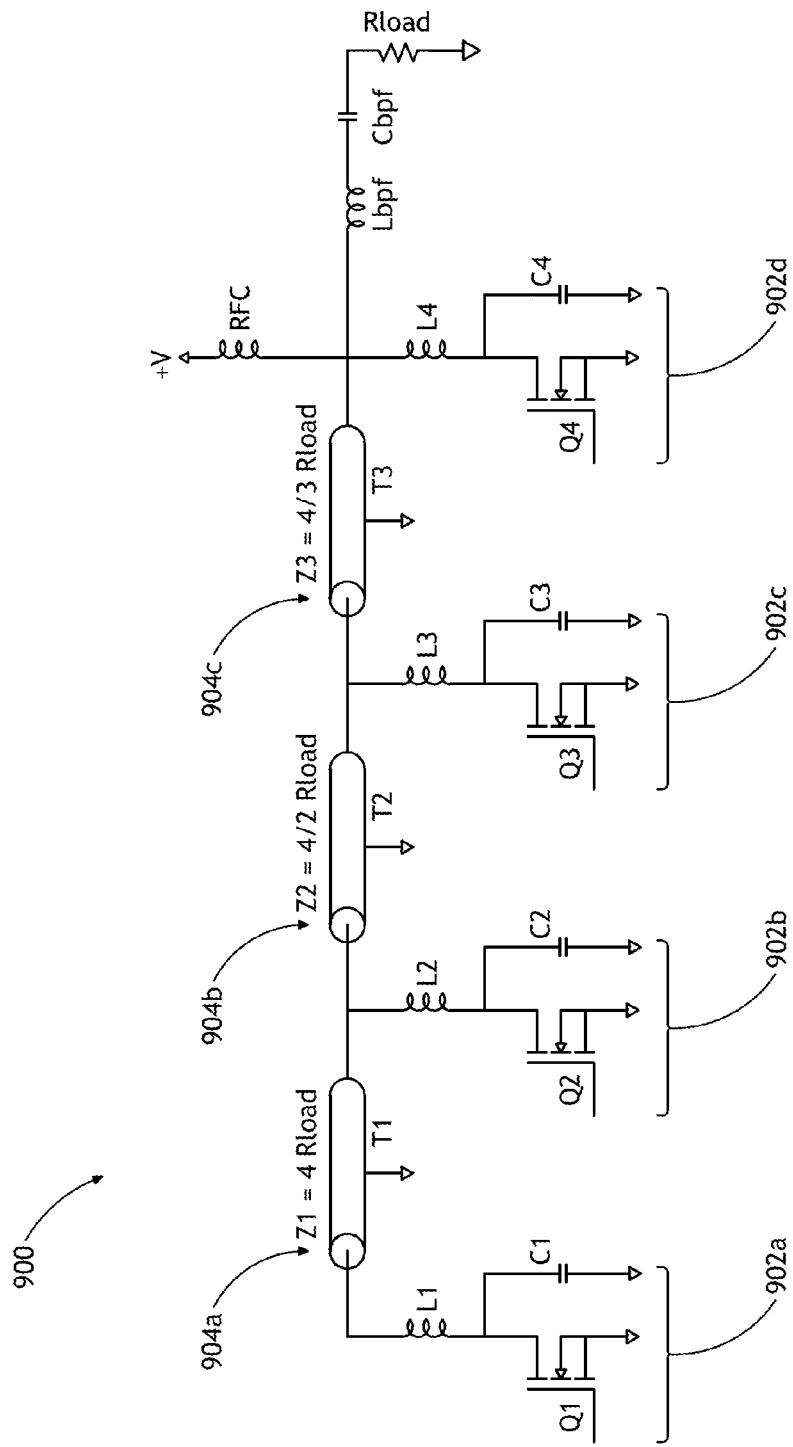
FIG. 9 is a circuit diagram illustrating a distributed parallel mode Class E power amplifier, in accordance with one embodiment of the present invention.

Referring now to FIG. 9, a circuit diagram for a distributed switching power amplifier 900 constructed by combining multiple Class-E switching power amplifier (PA) sub-circuits 902a-902d in a quasi-parallel configuration is displayed. As observed in the case of the Class D and parallel mode Class F distributed switching power amplifiers, the voltage waveforms at each Class E switching PA sub-circuit 902a-902d are substantially equivalent due to the parallel nature of the parallel mode Class E distributed switching PA 900. In a manner analogous to the distributed Class D power amplifier 700 and the distributed Class E power amplifier 800, Class E switching PA sub-circuits 902a-902d may be combined utilizing connection network sub-circuits 904a-904c in order to ensure the drain current of each Class E switching PA sub-circuit is substantially equivalent.

Further, the tapered impedance requirements present in the distributed Class D switching PA 700 and the parallel mode Class F switching PA 800 also exists in the parallel mode Class E switching PA 900. More specifically, the impedance profile for connection network sub-circuits 904a-904c must be tapered. The tapering may occur such that, given an output load of Rload, the impedances of the 904a, 904b, and 904c connection networks required to ensure the current waveforms at each Class E switching PA sub-circuit 902a-902d are equivalent are 4·Rload, (4/2)·Rload, and (4/3)·Rload respectively, as illustrated by Z1, Z2, and Z3 in FIG. 9. In a general sense, not limited to the specific illustration provided above, the impedance of each successive connection networks 904a, 904b, and 904c may be expressed using equation 1 above, in a manner similar to the distributed Class D switching PA and parallel mode distributed Class F switching PA context. Additionally, In contrast to the distributed Class D PA 700 and the parallel mode distributed class F PA 800, the series-drain choke (e.g., L1, L2, and L3) of each connection network sub-circuit 904a-904c may maintain the impedance for the RF harmonics as required by the Class E sub-circuits 902a-902d. As a result, the specific topology of the connection network sub-circuits 904a-904c is not critical. Consequently, a user may implement transmission lines, a Pi-networks, or T-networks, illustrated in FIGS. 6A through 6C, as the connection network sub-circuits 904a-904c of the parallel mode distributed Class E PA as is convenient. For example, as illustrated in FIG. 9, transmission line sections T1-T3 may be utilized as the connection network sub-circuit 904a-904c.

It is recognized that in each of the examples described above, the parallel-combination of PA transistors results in the output loading being a fraction of the impedance seen by each individual PA sub-circuit. This is the preferred application for PA devices operating from high voltage, such as GaN devices, SiC devices or vacuum tubes.

Figure 10:
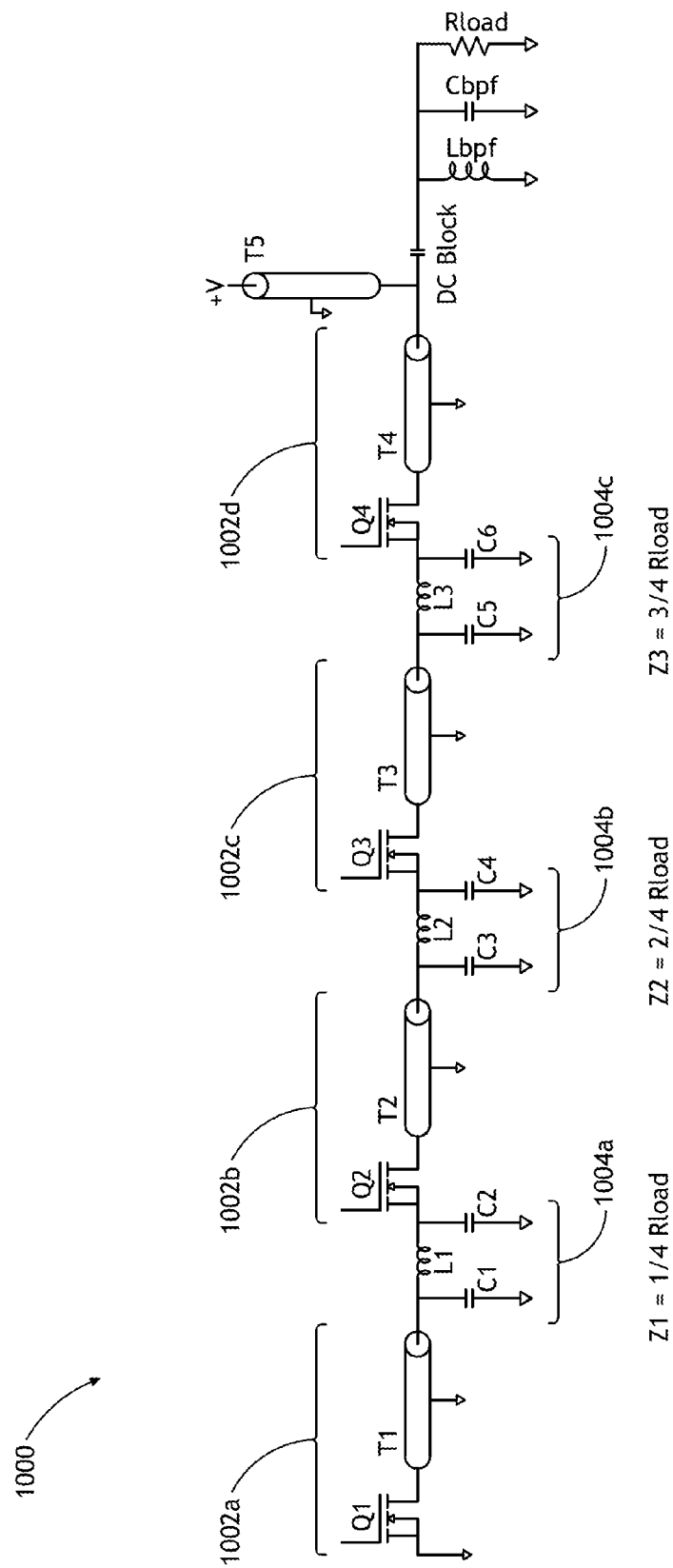
FIG. 10 is a circuit diagram illustrating a distributed series mode Class F power amplifier, in accordance with one embodiment of the present invention.

Referring now to FIG. 10, a circuit diagram for a distributed switching power amplifier 1000 constructed by combining multiple Class-F switching power amplifier (PA) sub-circuits 1002a-1002d in a quasi-series configuration is displayed. In contrast to the parallel mode arrangements of the Class D, E and F distributed power amplifiers described above, the current waveforms at each switching PA sub-circuit 1002a-1002d are equivalent due to the series nature of the series mode distributed Class F switching PA. As a result, the connection network sub-circuits 1004a-1004c are utilized in order to transform the voltage waveforms such that the voltage waveforms are substantially equivalent at each Class F switching PA sub-circuit 1002a-1002d.

In a further aspect, illustrated in FIG. 10, each switching PA sub-circuit 1002a-1002d must be presented with a load impedance, provided by the connection network sub-circuits 1004a-1004c, which decreases successively with each switching PA sub-circuit progressing toward the load. For purposes of illustration, it is assumed herein that the output loading of the distributed switching PA 1000 is equal to the quantity "Rload," as illustrated in FIG. 10. In one embodiment, it is recognized that if the output loading equals Rload and there exist four switching PA sub-circuits (e.g., 1002a-1002d) then switching PA sub-circuit 1002a is presented with an impedance of (1/4)·Rload. The next switching PA sub-circuit 1002b may be presented with an impedance of (2/4)·Rload. However, when the current from the first switching PA sub-circuit 1002a is summed, the effective impedance at the second switching PA sub-circuit 1002b is 4·Rload. Similarly, the impedance at the third switching PA sub-circuit 1002c is (3/4)·Rload. Again, when summed with the currents of the previous PA sub-circuits, the effective impedance at the third switching PA sub-circuit is 4·Rload. It is recognized that the use of this tapered impedance configuration allows for the presentation of an equivalent effective load impedance of Rload at each switching PA sub-circuit 1002a-1002d of the distributed switching PA 1000.

Moreover, the impedances of the configuration described above are provided via the connection network sub-circuits 1004a-1004c, wherein the characteristic impedances of the connection network sub-circuits 1004a-1004c are equal to the above impedances. More specifically, the impedances of each of the connection network sub-circuits 1004a-1004c used to connect successive switching PA sub-circuits 1002a-1002d for the above example are given by (1/4)·Rload, (2/4)·Rload, and (3/4)·Rload respectively, as illustrated by Z1, Z2, and Z3 in FIG. 10.

In a general sense, the impedance for each successive node in the series mode distributed Class F switching PA may be expressed by:

$$Z_m = Z_0\left(\frac{m-1}{n}\right) \quad \text{(Eqn. 2)}$$

where $Z_0$ represents the load impedance of the distributed switching PA, n represents the number of switching PA sub-circuits in the distributed switching PA, and m represents the given node. It should be noted that when used in this context n must be greater than 2 and m must be equal to or greater than 2 but less than n.

Similar to the parallel mode configuration, it is further recognized that since the connection network sub-circuits 1004a-1004c may be selected to impart a 90° phase shift at the frequency of operation, the drive signal to each successive switching PA sub-circuit is also delayed by 90°. In a complimentary fashion to the parallel mode distributed Class-F PA, the connection network sub-circuits 1004a-1004c may include a plurality of pi-networks. Each pi-network may serve to series combine adjacent Class-F switching PA sub-circuits.

Figure 11:
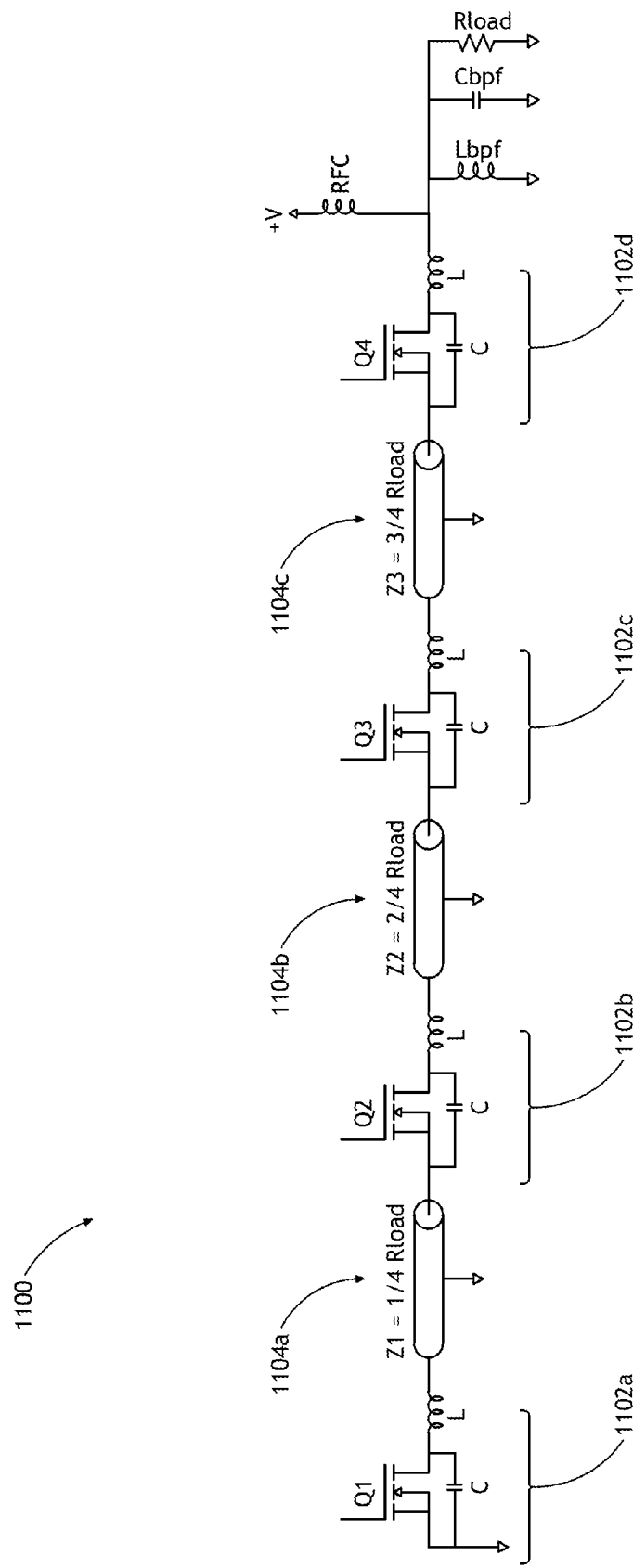
FIG. 11 is a circuit diagram illustrating a distributed series mode Class E power amplifier, in accordance with one embodiment of the present invention.

Referring now to FIG. 11, a circuit diagram for a distributed switching power amplifier 1100 constructed by combining multiple Class-E switching power amplifier (PA) sub-circuits 1102a-1102d in a quasi-series configuration is displayed. Similarly to the series mode distributed Class-F PA 1000, the current waveforms at each switching PA sub-circuit 1102a-1102d are equivalent due to the series nature of the series mode distributed Class E switching PA. Therefore, the connection network sub-circuits 1104a-1104c are utilized in order to transform the voltage waveforms such that the voltage waveforms are substantially equivalent at each Class-E switching PA sub-circuit 1102a-1102d.

Analogously to the distributed Class-E PA 1000 described above, each switching PA sub-circuit 1102a-1102d must be presented with a load impedance, provided by the connection network sub-circuits 1104a-1104c, which decreases successively with each switching PA sub-circuit progressing toward the load. The tapered impedances associated to the Class-E PA 1100 are analogous to those for the Class-F PA 1000. More specifically, given an output loading of Rload the impedance presented at the switching sub-circuits 1104a, 1104b, 1104c, and 1104d are (1/4)·Rload, (2/4)·Rload, and (3/4)·Rload respectively, as illustrated by Z1-Z3 in FIG. 11. It is recognized that the use of this tapered impedance configuration allows for the presentation of an equivalent effective load impedance of Rload at each switching PA sub-circuit 1102a-1102d of the distributed switching PA 1100. In a general sense, not limited to the specific illustration provided above, the impedance of each successive connection networks 1104a, 1104b, and 1104c may be expressed using equation 2 above.

In a complimentary fashion to the parallel mode distributed Class-E PA, the connection network sub-circuits 1104a-1104c may include a plurality of quarter-wave transmission lines labeled T1-T3 in FIG. 11. Each quarter-wave transmission line may serve to series combine adjacent Class-F switching PA sub-circuits.

It is further contemplated that since the series mode distributed amplifiers 1000 and 1100 are floating, it may be necessary to provide an isolated drive circuit for these devices. Consequently, these circuits may provide ideal applications for optically-driven OSISE and MOSISE circuits.

In addition to the various examples of the present invention provided above, it is further contemplated that the concepts described herein may be extended to numerous other embodiments. In one such embodiment, two complimentary series mode distributed power amplifiers (e.g., distributed Class F 1000 or distributed Class E 1100) may be coupled in a manner analogous to the upper and lower transistors in the half-bridge of a push-pull Class F power amplifier (illustrated in FIG. 3). Thus, applying this concept to series mode Class E or series mode Class F distributed amplifies a distributed Class E half-bridge or a distributed Class F half-bridge may be constructed.

In another embodiment of the present invention, the concepts used to develop the series and parallel distributed networks described herein may be extended to construct a two-dimensional distributed PA network. For instance, multiple individual PA transistors may be interconnected utilizing various combinations of transmissions lines, pi-networks, T-networks, or like impedance matching networks to form a two-dimensional array of power amplifiers which are combined to a single point within any position in the array. In a further embodiment, this concept may be extended to construct a three-dimensional distributed PA network. For instance, multiple individual PA transistors may be interconnected utilizing various combinations of transmissions lines, pi-networks, T-networks, or like impedance matching networks to form a three-dimensional array of power amplifiers which are combined to a single point within any position in the array.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A distributed power amplifier, comprising:
   a plurality of switching power amplifier sub-circuits; and
   a plurality of connection network sub-circuits, each of the plurality connection network sub-circuits having a characteristic impedance,
   wherein each of the plurality of connection network sub-circuits combines at least two of the plurality of switching power amplifier sub-circuits into a substantially series configuration such that each of the plurality of switching power amplifier sub-circuits is presented with a substantially equivalent current waveform,
   wherein the plurality of switching power amplifier sub-circuits, the plurality of connection network sub-circuits and the characteristic impedance of each of the plurality of connection network sub-circuits are configured to present each of the plurality of switching power amplifier sub-circuits with a substantially equivalent load impedance such that each of the plurality of switching power amplifier sub-circuits has a substantially equivalent drain voltage waveform.

2. The distributed power amplifier of claim 1, wherein the characteristic impedances of successive connection network sub-circuits of the plurality of connection network sub-circuits are tapered.

3. The distributed power amplifier of claim 1, wherein the characteristic impedances of successive connection network sub-circuits of the plurality of connection network sub-circuits are tapered, wherein the characteristic impedances of successive connection network sub-circuits of the plurality of connection network sub-circuits decreases with each connection network sub-circuit toward a load.

4. The distributed power amplifier of claim 1, wherein the plurality of switching power amplifier sub-circuits comprises at least one of a plurality of Class E switching power amplifier sub-circuits or a plurality of Class F switching power amplifier sub-circuits.

5. The distributed power amplifier of claim 1, wherein each of the plurality of connection network sub-circuits comprise:
   a connection network sub-circuit configured to perform an impedance transformation.

6. The distributed power amplifier of claim 5, wherein the connection network sub-circuit configured to perform an impedance transformation comprises at least one of a quarter-wave transmission line sub-circuit, a pi-network sub-circuit, or a T-network sub-circuit.

7. The distributed power amplifier of claim 5, wherein the connection network sub-circuit configured to perform an impedance transformation comprises:
   a connection network sub-circuit configured to provide low impedance to harmonic frequency currents at a drain circuit of a switching power amplifier sub-circuit.

8. The distributed power amplifier of claim 5, wherein the connection network sub-circuit configured to perform an impedance transformation comprises:
   a connection network sub-circuit configured to provide high impedance to harmonic frequency currents at a drain circuit of a switching power amplifier sub-circuit.

9. The distributed power amplifier of claim 1, wherein some of switching power amplifier sub-circuits of the plurality of switching power amplifier sub-circuits include one or more MOSFET transistors.

* * * * *